US012567449B2

(12) United States Patent
Kojima et al.

(10) Patent No.: US 12,567,449 B2
(45) Date of Patent: Mar. 3, 2026

(54) SEMICONDUCTOR DEVICE HAVING OUTPUT BUFFER

(71) Applicant: MICRON TECHNOLOGY, INC., Boise, ID (US)

(72) Inventors: Mieko Kojima, Hino (JP); Kazuyuki Morishige, Sagamihara (JP); Tetsuya Arai, Sagamihara (JP); Guangcan Chen, Machida (JP)

(73) Assignee: Micron Technology, Inc., Boise, ID (US)

( * ) Notice: Subject to any disclaimer, the term of this patent is extended or adjusted under 35 U.S.C. 154(b) by 188 days.

(21) Appl. No.: 18/674,788

(22) Filed: May 24, 2024

(65) Prior Publication Data

US 2024/0312498 A1 Sep. 19, 2024

Related U.S. Application Data

(62) Division of application No. 17/563,852, filed on Dec. 28, 2021, now Pat. No. 12,020,768.

(51) Int. Cl.
| | |
|---|---|
| *G11C 7/10* | (2006.01) |
| *G11C 5/06* | (2006.01) |
| *H03K 19/017* | (2006.01) |

(52) U.S. Cl.
CPC .............. *G11C 7/1057* (2013.01); *G11C 5/06* (2013.01); *G11C 7/1039* (2013.01); *H03K 19/01721* (2013.01)

(58) Field of Classification Search
CPC .................................................. G11C 7/1057
See application file for complete search history.

(56) References Cited

U.S. PATENT DOCUMENTS

| | | |
|---|---|---|
| 2008/0112253 A1 | 5/2008 | Youn et al. |
| 2012/0243286 A1 | 9/2012 | Inaba |
| 2015/0256175 A1* | 9/2015 | Ota ...................... H10D 89/811 |
| | | 327/306 |
| 2015/0348601 A1 | 12/2015 | Onuki |
| 2017/0194037 A1 | 7/2017 | Fujiwara et al. |
| 2017/0256548 A1 | 9/2017 | Hsu et al. |
| 2020/0335513 A1 | 10/2020 | Morozumi et al. |
| 2023/0206966 A1 | 6/2023 | Kojima et al. |

* cited by examiner

*Primary Examiner* — Hoai V Ho
(74) *Attorney, Agent, or Firm* — Dorsey & Whitney LLP

(57) ABSTRACT

Some embodiments provide an apparatus including a semiconductor substrate having source regions and regions alternately arranged in a first direction; gate electrodes between the source regions and the drain regions; a first wiring layer including first conductive patterns covering the source regions and second conductive patterns covering the drain regions; first via conductors between the first conductive patterns and the source regions; second via conductors between the second conductive patterns and the drain regions; a second wiring layer over the first wiring layer, including third conductive patterns covering the first conductive patterns and fourth conductive patterns covering the second conductive patterns; third via conductors between the third conductive patterns and the first conductive patterns; and fourth via conductors between the fourth conductive patterns and the second conductive patterns. The fourth via conductors are shifted from the third via conductors in a second direction perpendicular to the first direction.

20 Claims, 9 Drawing Sheets

SEMICONDUCTOR DEVICE HAVING OUTPUT BUFFER

CROSS REFERENCE TO RELATED APPLICATION(S)

This application is a divisional application of U.S. application Ser. No. 17/563,852, filed Dec. 28, 2021. The aforementioned application is incorporated herein by reference, in its entirety, for any purpose.

BACKGROUND

A semiconductor device such as a DRAM (Dynamic Random Access Memory) has a data I/O terminal for inputting and outputting data. It is desired to lower capacitance added to the data I/O terminal to increase a data transfer rate via the data I/O terminal and to reduce current consumption associated with data input/output.

DETAILED DESCRIPTION

Various embodiments of the present disclosure will be explained below in detail with reference to the accompanying drawings. The following detailed description refers to the accompanying drawings that show, by way of illustration, specific aspects, and various embodiments of the present disclosure. The detailed description provides sufficient detail to enable those skilled in the art to practice these embodiments of the present disclosure. Other embodiments may be utilized, and structural, logical, and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
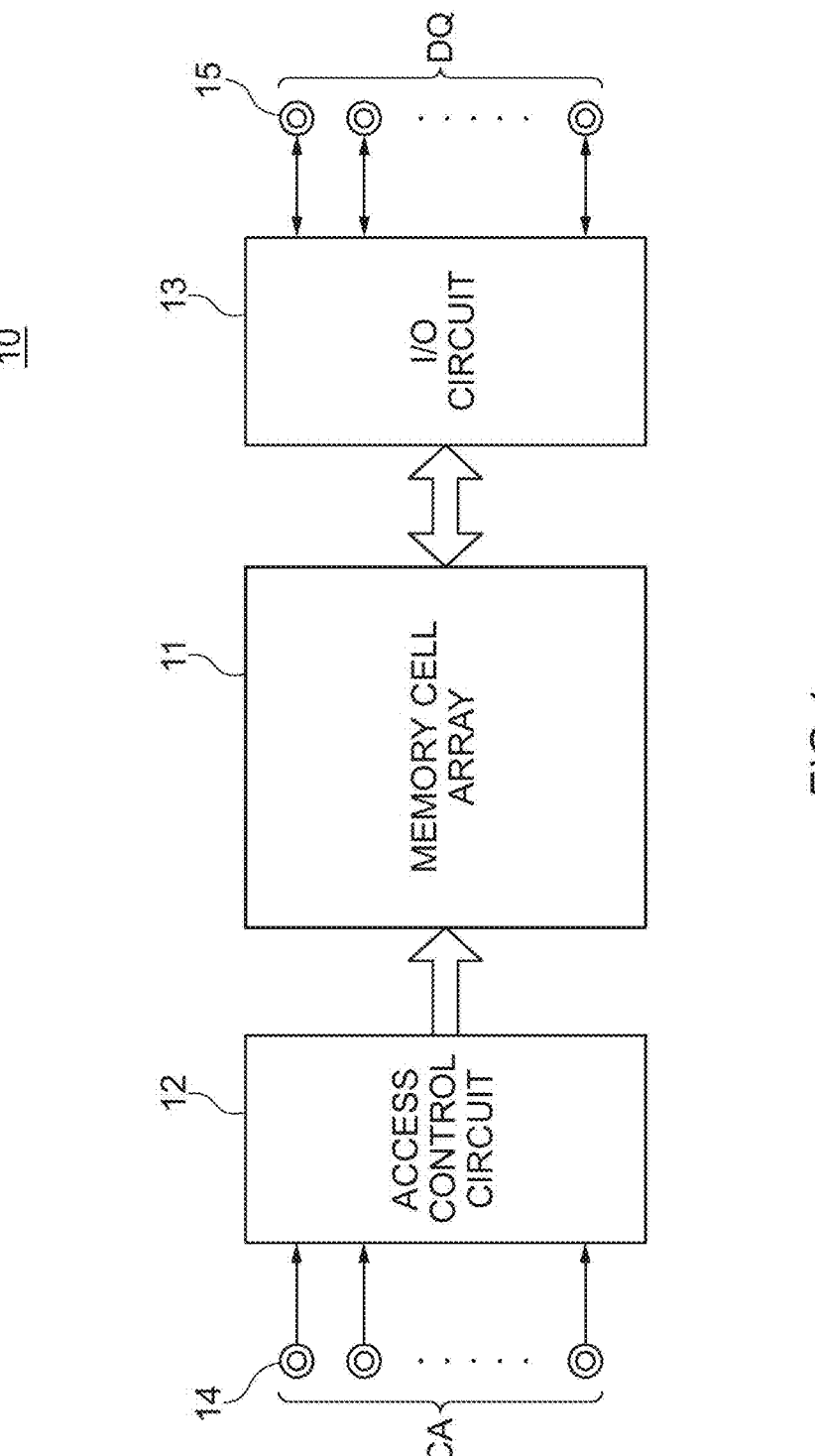
FIG. 1 is a block diagram showing a configuration of a semiconductor device according to an embodiment of the present disclosure.

FIG. 1 is a block diagram showing a configuration of a semiconductor device 10 according to an embodiment of the present disclosure. The semiconductor device 10 shown in FIG. 1 is, for example, a DRAM and includes a memory cell array 11, an access control circuit 12 that performs an access to the memory cell array 11, and an I/O circuit 13 that performs input/output of data to/from the memory cell array 11. The access control circuit 12 performs an access to the memory cell array 11 on the basis of a command address signal CA input from an external controller through a command address terminal 14. At the time of a read operation, data DQ read from the memory cell array 11 is output to a data I/O terminal 15 via the I/O circuit 13. At the time of a write operation, data DQ input to a data I/O terminal 15 from an external controller is written into the memory cell array 11 via the I/O circuit 13.

Figure 2:
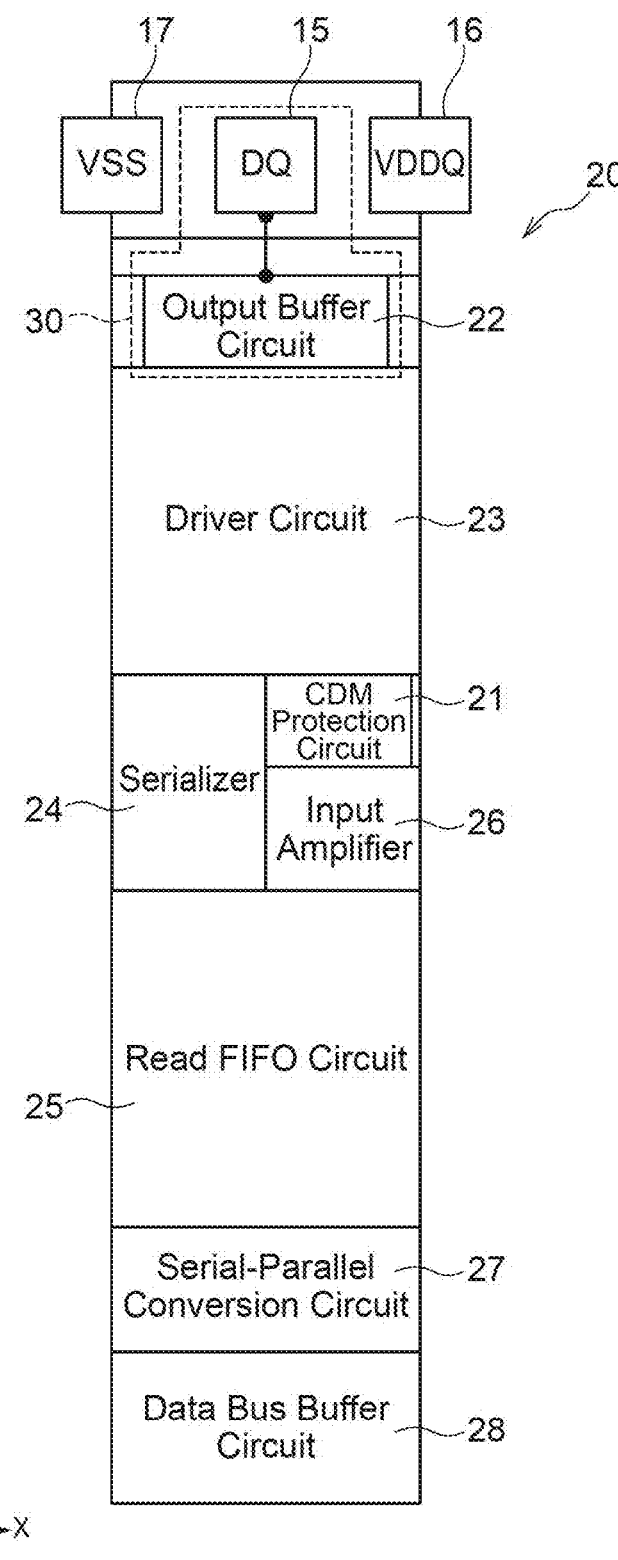
FIG. 2 is a block diagram of a data input/output circuit allocated to a data I/O terminal.

FIG. 2 is a block diagram of a data input/output circuit 20 allocated to each data I/O terminal 15. As shown in FIG. 2, the data input/output circuit 20 includes a CDM protection circuit 21, an output buffer circuit 22, a driver circuit 23, a serializer 24, a read FIFO circuit 25, an input amplifier 26, a serial-parallel conversion circuit 27, and a data bus buffer circuit 28. The CDM protection circuit 21 is a circuit that protects the data input/output circuit 20 from electrostatic discharge damages. The output buffer circuit 22 is a circuit that outputs read data DQ to the data I/O terminal 15 at the time of a read operation. The driver circuit 23 is a circuit that drives the output buffer circuit 22 on the basis of the read data DQ. The serializer 24 is a circuit that converts parallel read data DQ into serial data and supplies the serial data to the driver circuit 23. The read FIFO circuit 25 is a circuit that supplies read data DQ supplied from the memory cell array 11 via a data bus to the serializer 24 at the time of a read operation. The input amplifier 26 is a circuit that receives write data DQ input via the data I/O terminal 15 at the time of a write operation. The serial-parallel conversion circuit 27 is a circuit that converts serial write data DQ output from the input amplifier 26 to parallel data. The data bus buffer circuit 28 is a circuit that outputs the write data DQ converted into parallel data to the data bus. A power supply terminal 16 supplied with a power potential VDDQ and a power supply terminal 17 supplied with a power potential VSS are placed on both sides in an X direction of the data I/O terminal 15, respectively. The X direction and a Y direction are perpendicular. The output buffer circuit 22 operates with a voltage between the power potential VDDQ and the power potential VSS.

Figure 3:
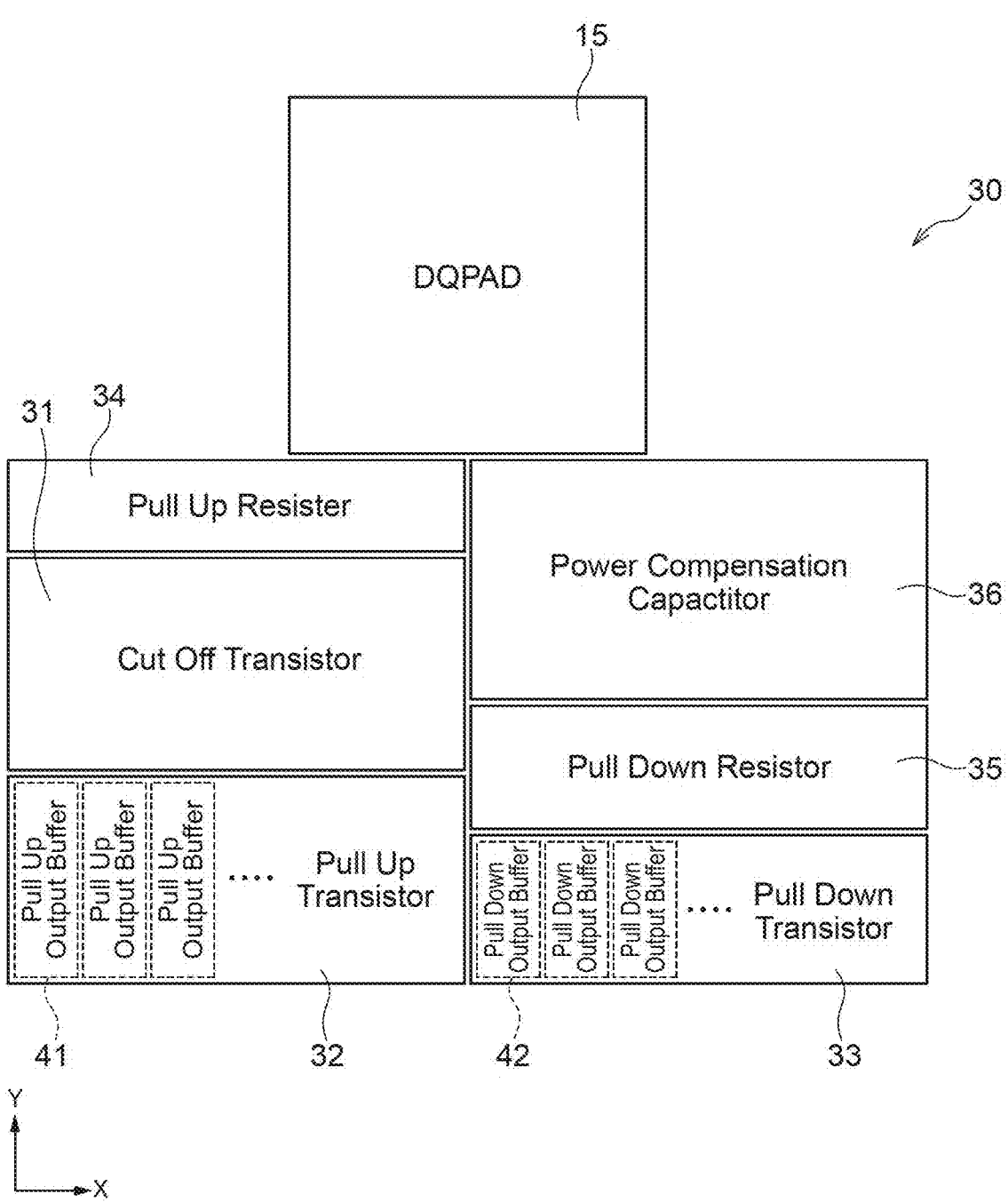
FIG. 3 is a layout diagram of an output buffer circuit.

FIG. 3 is a layout diagram for explaining a layout of a region 30 shown in FIG. 2 in more detail. As shown in FIG. 3, the region 30 in which the output buffer circuit 22 is placed includes a cut off transistor region 31, a pull up transistor region 32, a pull down transistor region 33, a pull up resistor region 34, a pull down resistor region 35, and a power compensation capacitor region 36. A plurality of pull up output buffers 41 arranged in the X direction are placed in the pull up transistor region 32. A plurality of pull down output buffers 42 arranged in the X direction are placed in the pull down transistor region 33. A compensation capacitor for suppressing power supply noise is placed in the power compensation capacitor region 36.

Figure 4:
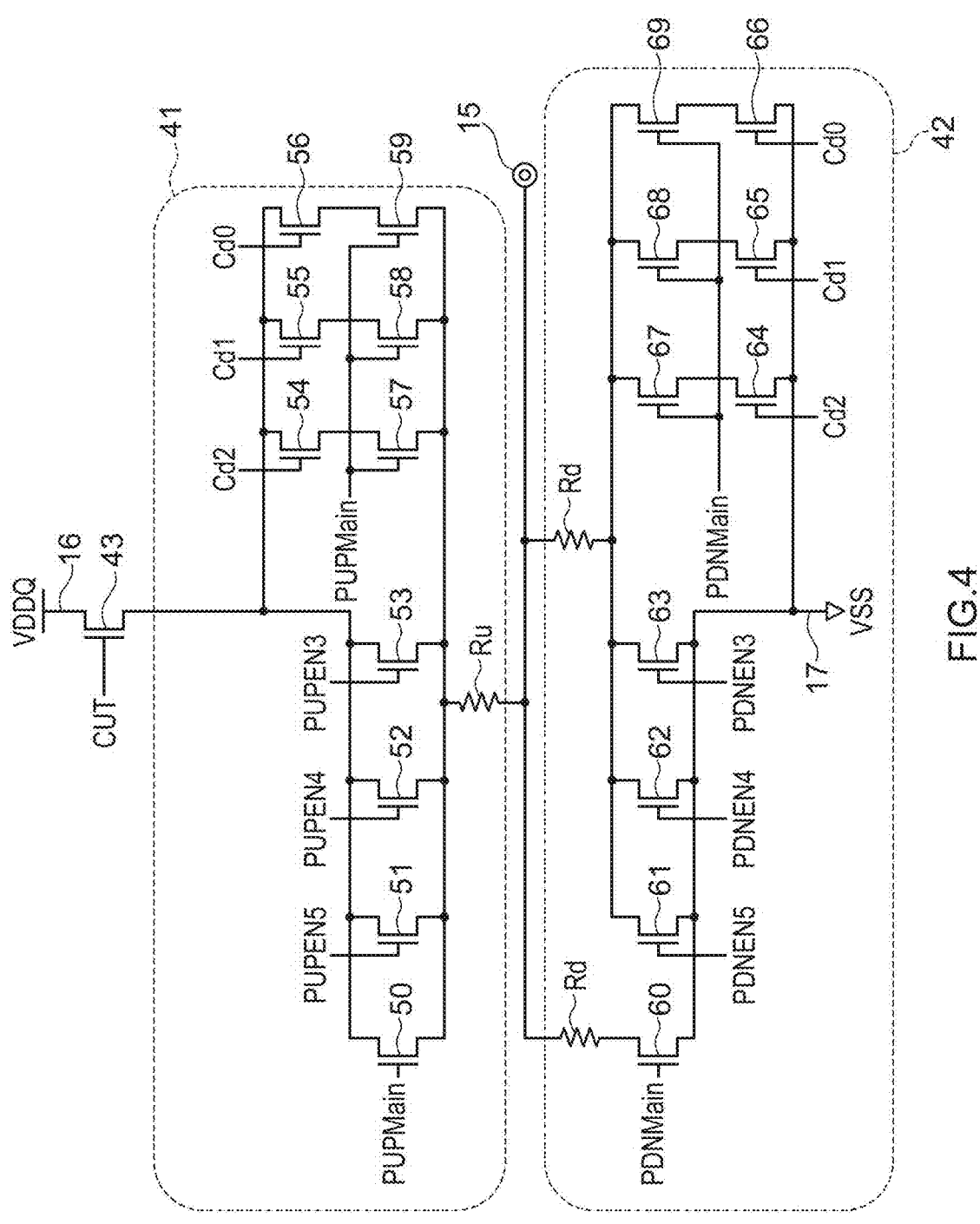
FIG. 4 is a circuit diagram of pull up output buffers and pull down output buffers.

FIG. 4 is a circuit diagram of the pull up output buffers 41 and the pull down output buffers 42. As shown in FIG. 4, each of the pull up output buffers 41 has transistors 50 to 56 coupled in parallel to each other. Transistors 57 to 59 are coupled in series to the transistors 54 to 56, respectively. While the transistors 50 to 59 are N-channel MOS transistors in the example shown in FIG. 4, it is also possible to use P-channel MOS transistors. Drains of the transistors 50 to 56 are coupled to the power supply terminal 16 via a cutoff transistor 43. Sources of the transistors 50 to 53 and 57 to 59 are coupled to the data I/O terminal 15 via a pull up resistor Ru. A cutoff signal CUT is supplied to a gate electrode of the cutoff transistor 43. The cutoff signal CUT is deactivated during a period in which read data is not output, and the current consumption is accordingly reduced. Each of the pull down output buffers 42 has transistors 60 to 66 coupled in parallel to each other. Transistors 67 to 69 are coupled in series to the transistors 64 to 66, respectively. Sources of the transistors 60 to 66 are coupled to the power supply terminal 17. Drains of the transistors 60 to 63 and 67 to 69 are coupled to the data I/O terminal 15 via a pull down resistor Rd.

Pull up signals PUPMain, PUPEN5, PUPEN4, PUPEN3, Cd2, Cd1, and Cd0 are supplied to gate electrodes of the transistors 50 to 56, respectively. The pull up signal PUP-Main is a signal that is always activated when high-level read data is to be output. The pull up signals PUPEN5, PUPEN4, PUPEN3, Cd2, Cd1, and Cd0 are signal for adjusting the capability of the pull up output buffer 41 and whether to activate these signals when high-level read data is output is determined according to a parameter set in a mode register. The pull up signal PUPMain is supplied to gate electrodes of the transistors 57 to 59. Pull down signals PDNMain, PDNEN5, PDNEN4, PDNEN3, Cd2, Cd1, and Cd0 are supplied to gate electrodes of the transistors 60 to 66, respectively. The pull down signal PDNMain is a signal that is always activated when low-level read data is to be output. The pull down signals PDNEN5, PDNEN4, PDNEN3, Cd2, Cd1, and Cd0 are signals for adjusting the capability of the pull down output buffer 42 and whether to activate these signals when low-level read data is output is determined according to a parameter set in the mode register. The pull down signal PDNMain is supplied to gate electrodes of the transistors 67 to 69.

Figure 5:
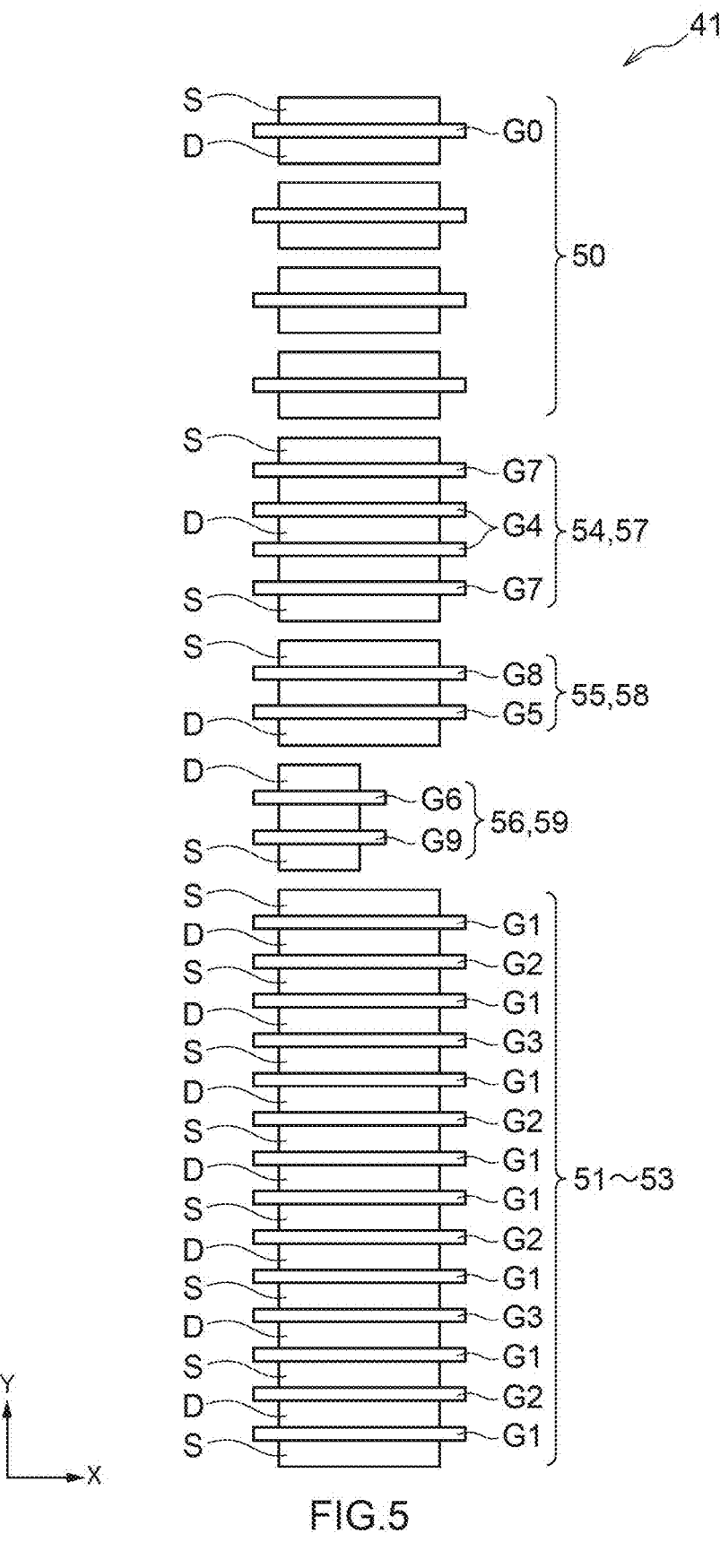
FIG. 5 is a layout diagram of transistors constituting a pull up output buffer.

FIG. 5 is a layout diagram of the transistors 50 to 59 constituting each of the pull up output buffers 41. As shown in FIG. 5, the transistors 50 to 59 constituting each of the pull up output buffers 41 are arranged in a Y direction. The transistor 50 has a configuration in which a plurality of transistors each including a source region S and a drain region D are formed on a semiconductor substrate, and a gate electrode G0 covering the semiconductor substrate located between the source region S and the drain region D are coupled in parallel to each other. Each of the transistors 51 to 53 includes a plurality of source regions S and a plurality of drain regions D alternately arranged in the Y direction, and a plurality of gate electrodes G1 to G3. There are differences in the number of the gate electrodes G1 to G3 and the capabilities of the transistors 51 to 53 are accordingly weighted. A series circuit constituted of the transistors 54 and 57 is realized by placing two gate electrodes G4 and G7 between a source region S and a drain region D. A series circuit constituted of the transistors 55 and 58 is realized by placing two gate electrodes G5 and G8 between a source region S and a drain region D. A series circuit constituted of the transistors 56 and 59 is realized by placing two gate electrodes G6 and G9 between a source region S and a drain region D. There are differences in the numbers of the gate electrodes G4 to G9 or the gate widths thereof and accordingly the capabilities of the series circuit constituted of the transistors 54 and 57, the series circuit constituted of the transistors 55 and 58, and the series circuit constituted of the transistors 56 and 59 are weighted. The source regions S and the drain regions D may be at the opposite locations to those shown in FIG. 5.

Figure 6:
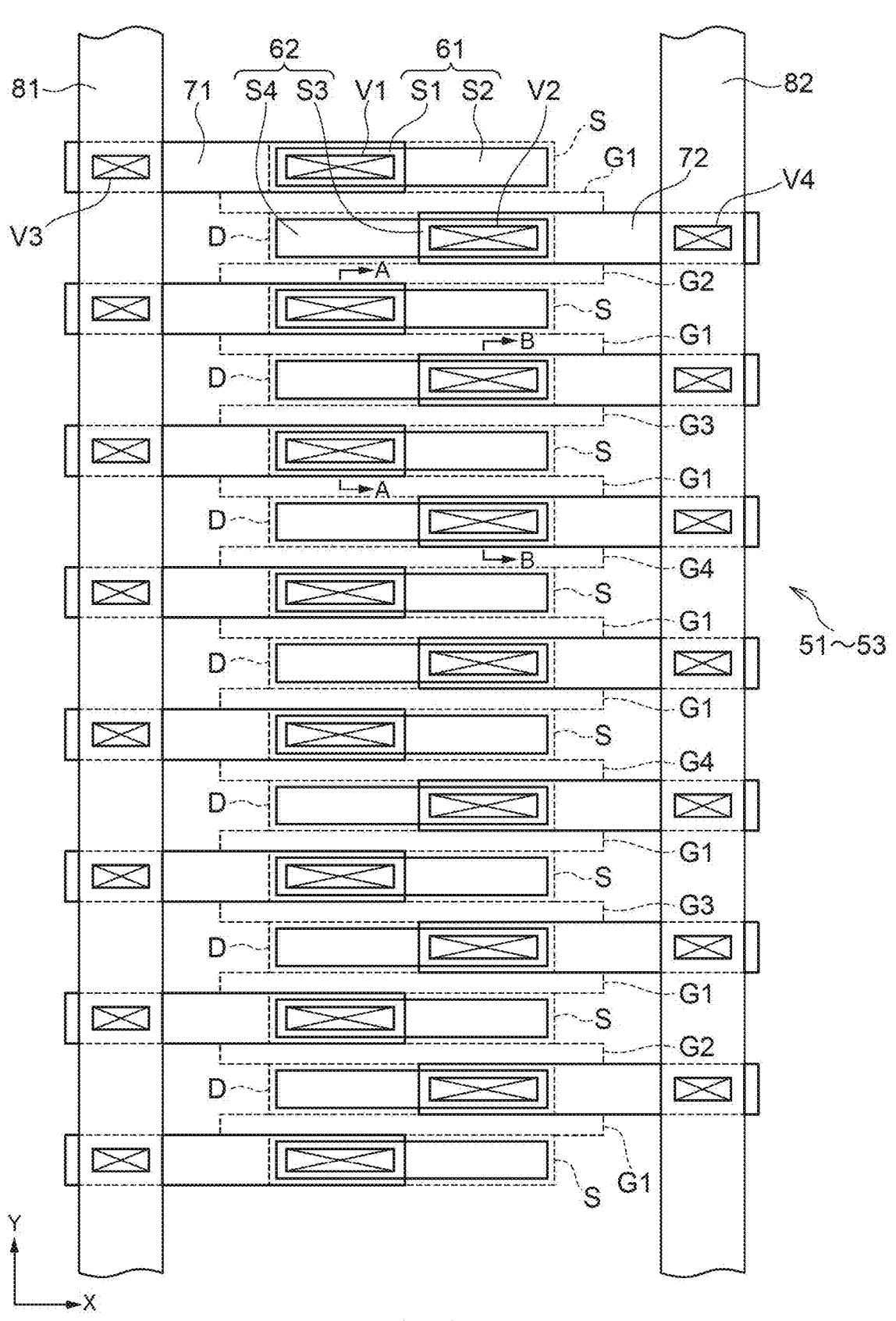
FIG. 6 is a layout diagram of lines coupled to source regions and drain regions.

FIG. 6 is a layout diagram of lines coupled to the source regions S and the drain regions of the transistors 51 to 53. In FIG. 6, the source regions S, the drain regions D, and the gate electrodes G1 to G3 constituting the transistors 51 to 53 are represented by broken lines. As shown in FIG. 6, each of the source regions S constituting the transistors 51 to 53 is covered with a conductive pattern 61, and each of the drain regions D constituting the transistors 51 to 53 is covered with a conductive pattern 62. The conductive patterns 61 and 62 are formed on a conductive layer M0 located in the lowermost layer. The conductive patterns 61 and 62 extend in the X direction similarly to the gate electrodes G1 to G3. Furthermore, a part of each of the conductive patterns 61 is covered with a conductive pattern 71 and a part of each of the conductive patterns 62 is covered with a conductive pattern 72. The conductive patterns 71 and 72 are formed on a conductive layer Li1 located above the conductive layer M0. The conductive patterns 71 and 72 also extend in the X direction. A via conductor V1 connecting an associated one of the conductive patterns 61 to an associated one of the conductive patterns 71 is provided at a location where the conductive pattern 61 and the conductive pattern 71 overlap with each other. A via conductor V2 connecting an associated one of the conductive patterns 62 to an associated one of the conductive patterns 72 is provided at a location where the conductive pattern 62 and the conductive pattern 72 overlap with each other. The conductive patterns 71 are coupled in common to a conductive pattern 81 extending in the Y direction. The conductive patterns 72 are coupled in common to a conductive pattern 82 extending in the Y direction. The conductive patterns 81 and 82 are formed on a conductive layer M1 located above the conductive layer Li1. A via conductor V3 connecting an associated one of the conductive patterns 71 to the conductive pattern 81 is provided at a location where the conductive pattern 71 and the conductive pattern 81 overlap with each other. A via conductor V4 connecting an associated one of the conductive patterns 72 to the conductive pattern 82 is provided at a location where the conductive pattern 72 and the conductive pattern 82 overlap with each other. The conductive patterns 81 and 82 may be arranged at locations overlapping with the source regions S and the drain regions D.

Figure 7:
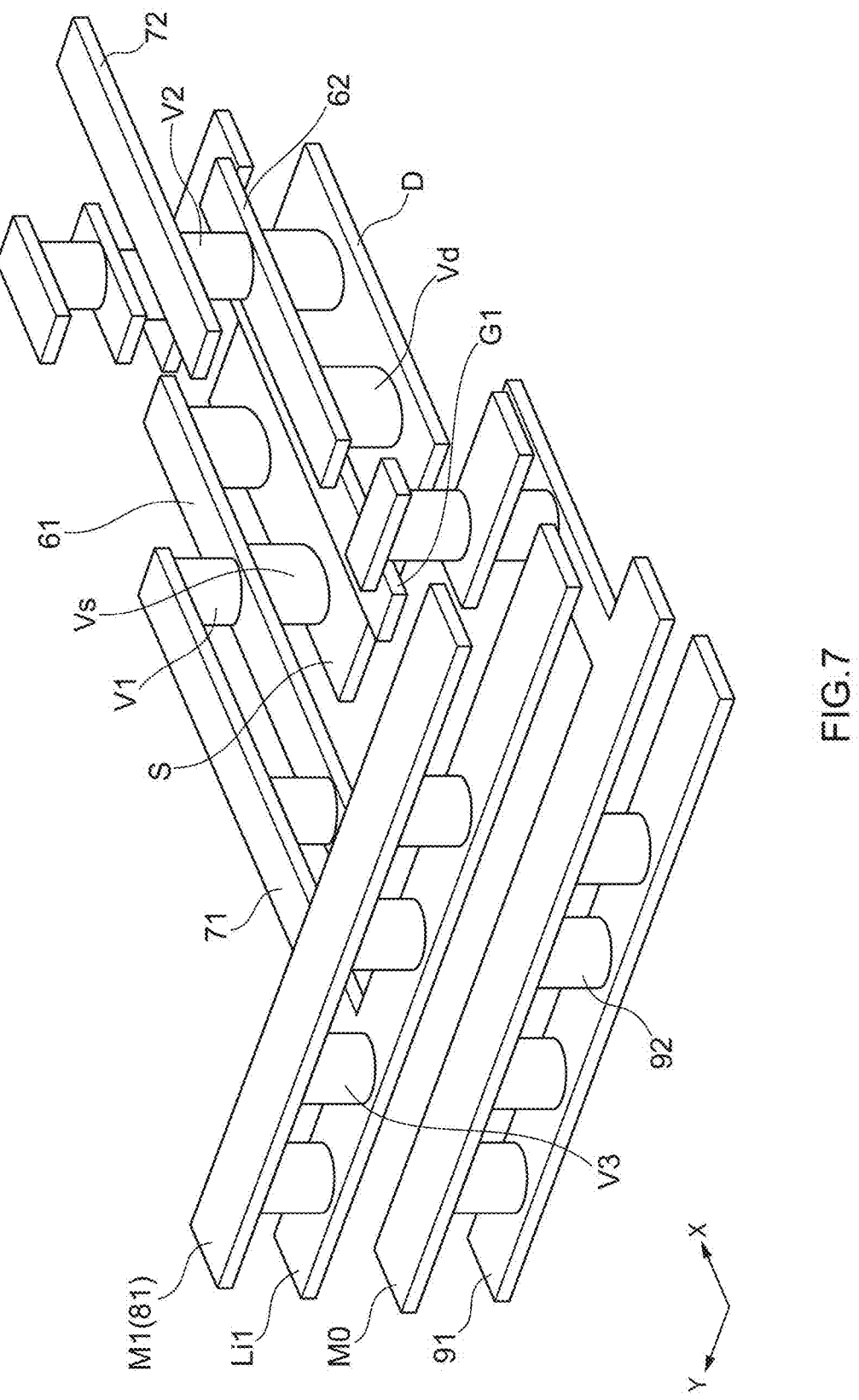
FIG. 7 is a schematic perspective view for explaining a positional relation among wiring layers.

FIG. 7 is a schematic perspective view for explaining a positional relation among the wiring layers. As shown in FIG. 7, in addition to the source regions S and the drain regions D, a well contact diffusion region 91 is provided on the semiconductor substrate. The conductive layer M0 is a conductive layer located in the lowermost layer provided on the semiconductor substrate. Conductive patterns formed on the conductive layer M0 extend in the X direction at least on formation regions of the transistors 50 to 59. However, some conductive patterns formed on the conductive layer M0, such as a conductive pattern for supplying a well potential to the well contact diffusion region 91 through via conductors 92, may extend in the Y direction. Among the conductive patterns formed on the conductive layer M0, the conductive patterns 61 each covering an associated one of the source regions S are coupled to the associated source regions S through via conductors Vs, respectively, and the conductive patterns 62 each covering an associated one of the drain regions D are coupled to the associated drain regions D through via conductors Vd, respectively. The conductive layer Li1 is a conductive layer located above the conductive layer M0. Conductive patterns formed on the conductive layer Li1 extend in the X direction at least on formation regions of the transistors 50 to 59. Some conductive patterns formed on the conductive layer Li1 may extend in the Y direction. Among the conductive patterns formed on the conductive layer Li1, the conductive patterns 71 each covering an associated one of the conductive patterns 61 are coupled to the associated conductive patterns 61 through the via conductors V1, respectively, and the conductive patterns 72 each covering an associated one of the conductive patterns 62 are coupled to the associated conductive patterns 62 through the via conductors V2, respectively. The conductive layer M1 is a conductive layer located above the conductive layer Li1. Conductive patterns formed on the conductive layer M1 mostly extend in the Y direction.

Each of the conductive patterns 71 covers a section S1 located on one side (the left side in FIG. 6) in the X direction of the associated conductive pattern 61 and does not cover a section S2 located on the other side (the right side in FIG. 6) in the X direction. Similarly, each of the conductive patterns 72 covers a section S3 located on one side (the right side in FIG. 6) in the X direction of the associated conductive pattern 62 and does not cover a section S4 located on the other side (the left side in FIG. 6) in the X direction. The sections S1 of the conductive patterns 61 are adjacent to the sections S4 of the conductive pattern 62 in the Y direction. The sections S2 of the conductive patterns 61 are adjacent to the sections S3 of the conductive patterns 62 in the Y direction. With this configuration, the length of parts adjacent in the Y direction in the conductive patterns 71 and the conductive patterns 72 is greatly reduced or the conductive patterns 71 and the conductive patterns 72 are prevented from being adjacent to each other in the Y direction. In the example shown in FIG. 6, the conductive pattern 71 and the conductive pattern 72 are not adjacent to each other in the Y direction. Therefore, the conductive patterns 71 are adjacent to each other in the Y direction with no conductive pattern 72 interposed therebetween, and the conductive patterns 72 are adjacent to each other in the Y direction with no conductive pattern 71 interposed therebetween. The via conductors V1 are arranged in the Y direction and the via conductors V2 are arranged in the Y direction. The center position of the via conductors V1 in the X direction and the center position of the via conductors V2 in the X direction are different from each other. Therefore, the via conductors V1 and V2 are arranged in a zigzag manner.

Figure 8A:
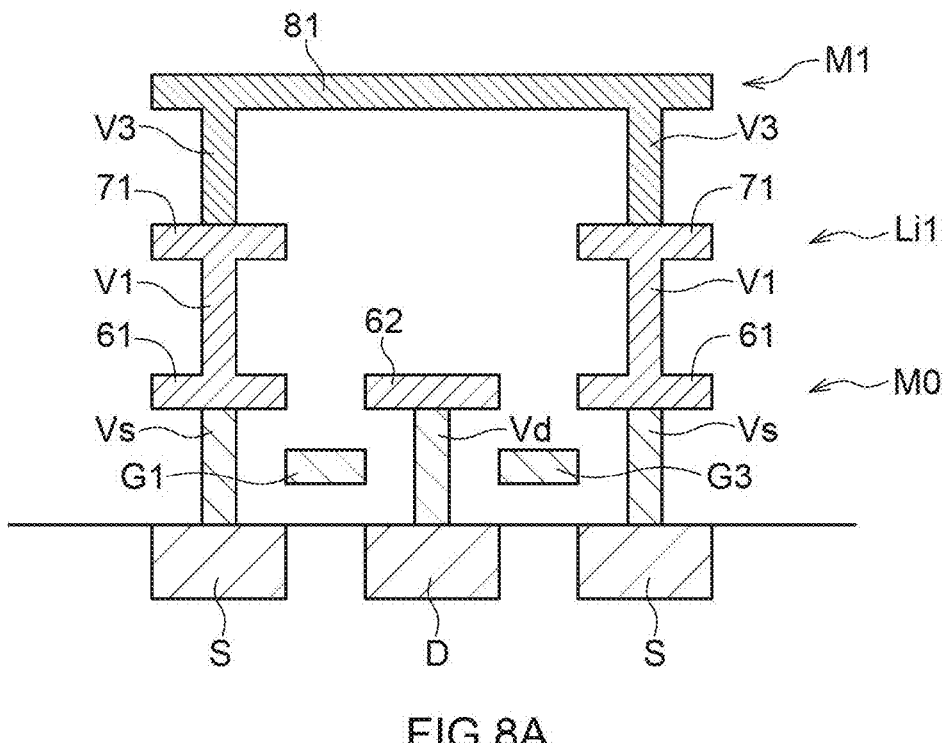
FIG. 8A is a schematic sectional view along a line A-A shown in FIG. 6.
Figure 8B:
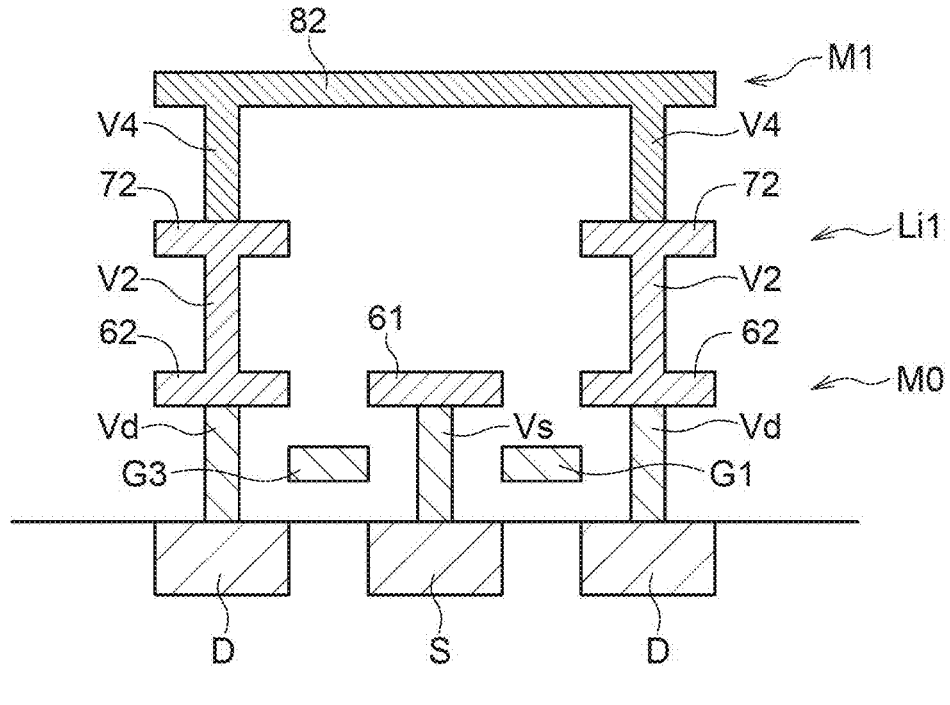
FIG. 8B is a schematic sectional view along a line B-B shown in FIG. 6.

As a result, since there is no conductive pattern 72 immediately above each of the conductive patterns 62 in a cross-section along a line A-A shown in FIG. 6, as shown in FIG. 8A, the capacitance is reduced compared to a case in which there is a conductive pattern 72 immediately above each of the conductive patterns 62 in the cross-section along the line A-A. Furthermore, even when the conductive pattern 81 is provided in the cross-section along the line A-A as in the example shown in FIG. 8A, the capacitance between the conductive patterns 72 and the conductive pattern 81 is also reduced because there is no conductive pattern 72 immediately below the conductive pattern 81. Similarly, since there is no conductive pattern 71 immediately above each of the conductive patterns 61 in a cross-section along a line B-B shown in FIG. 6, as shown in FIG. 8B, the capacitance is reduced compared to a case in which there is the conductive pattern 71 immediately above each of the conductive patterns 61 in the cross-section along the line B-B. Furthermore, even when the conductive pattern 82 is provided in the cross-section along the line B-B as in the example shown in FIG. 8B, the capacitance between the conductive patterns 71 and the conductive pattern 82 is also reduced because there is no conductive pattern 71 immediately below the conductive pattern 82.

Figure 9:
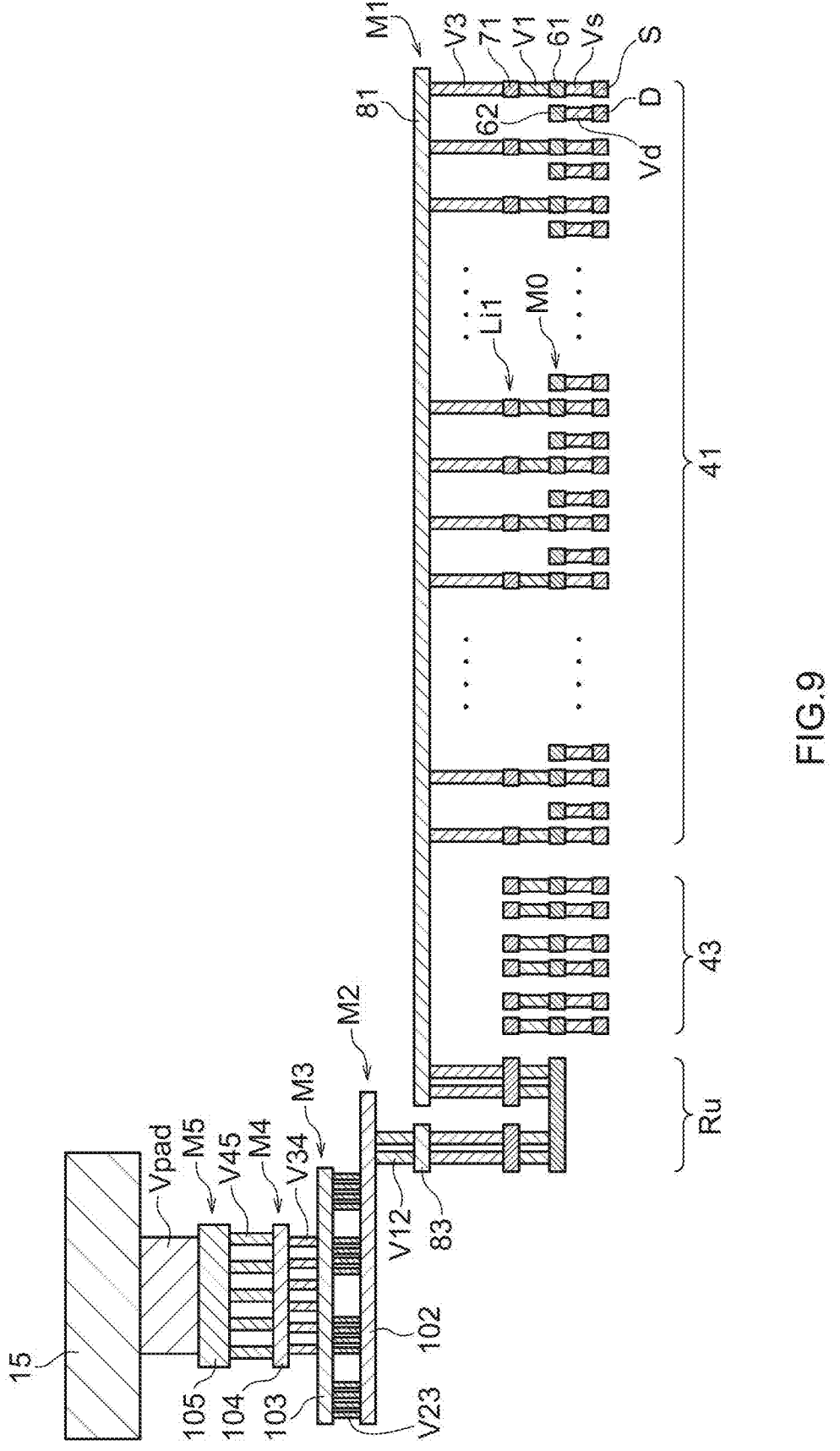
FIG. 9 is a schematic sectional view for explaining a coupling path between each of the pull up output buffers and one of the data I/O terminals.

FIG. 9 is a schematic sectional view for explaining a coupling path between each of the pull up output buffers 41 and one of the data I/O terminals 15. As shown in FIG. 9, the source regions S of the transistors 50 to 59 constituting the pull up output buffer 41 are coupled to the conductive pattern 81 located on the conductive layer M1 through the associated via conductors Vs, the associated conductive patterns 61, the associated via conductors V1, the associated conductive patterns 71, and the associated via conductors V3, respectively. In the cross-section shown in FIG. 9, the conductive patterns 72 and the via conductors V2 coupled to the drain regions D are omitted. The conductive pattern 81 is coupled to a conductive pattern 83 located on the conductive layer M1 through the pull up resistor Ru. The conductive pattern 83 is coupled to a conductive pattern 102 located on a conductive layer M2 through via conductors V12. The conductive pattern 102 is coupled to a conductive pattern 103 located on a conductive layer M3 through via conductors V23. The conductive pattern 103 is coupled to a conductive pattern 104 located on a conductive layer M4 through via conductors V34. The conductive pattern 104 is coupled to a conductive pattern 105 located on a conductive layer M5 through via conductors V45. The conductive pattern 105 is coupled to the data I/O terminal 15 through via conductors Vpad. A wiring layer in the uppermost layer where the data I/O terminals 15 are formed may be an iRDL (inline redistribution layer).

While the transistors 50 to 59 constituting each of the pull up output buffers 41 are explained above, the same holds for the transistors 60 to 69 constituting each of the pull down output buffers 42. Since this reduces the capacitance produced between the source and drain of each of the transistors 50 to 59 and the capacitance produced between the source and drain of each of the transistors 60 to 69, the capacitance added to the data I/O terminals 15 is reduced. As a result, the transfer rate for input/output data can be increased and the current consumption associated with input/output of data can be lowered.

Although various embodiments have been disclosed in the context of certain preferred embodiments and examples, it will be understood by those skilled in the art that the scope of the present disclosure extend beyond the specifically disclosed embodiments to other alternative embodiments and/or uses of the embodiments and obvious modifications and equivalents thereof. In addition, other modifications which are within the scope of this disclosure will be readily apparent to those of skill in the art based on this disclosure. It is also contemplated that various combination or subcombination of the specific features and aspects of the embodiments may be made and still fall within the scope of the disclosure. It should be understood that various features and aspects of the disclosed embodiments can be combined with or substituted for one another in order to form varying mode of the disclosed invention. Thus, it is intended that the scope of at least some of the present disclosure should not be limited by the particular disclosed embodiments described above.

The invention claimed is:

1. An apparatus, comprising:
a semiconductor substrate having a plurality of source regions and a plurality of drain regions alternately arranged in a first direction;
a plurality of gate electrodes covering the semiconductor substrate each located between an associated one of the plurality of source regions and an associated one of the plurality of drain regions;
a first wiring layer including a plurality of first conductive patterns each covering an associated one of the plurality of source regions, and the first wiring layer further including a plurality of second conductive patterns each covering an associated one of the plurality of drain regions;

a plurality of first via conductors each connected between an associated one of the plurality of first conductive patterns and an associated one of the plurality of source regions;

a plurality of second via conductors each connected between an associated one of the plurality of second conductive patterns and an associated one of the plurality of drain regions;

a second wiring layer located over the first wiring layer, the second wiring layer including a plurality of third conductive patterns each covering an associated one of the plurality of first conductive patterns, and the second wiring layer further including a plurality of fourth conductive patterns each covering an associated one of the plurality of second conductive patterns;

a plurality of third via conductors each connected between an associated one of the plurality of third conductive patterns and an associated one of the plurality of first conductive patterns; and a plurality of fourth via conductors each connected between an associated one of the plurality of fourth conductive patterns and an associated one of the plurality of second conductive patterns, wherein the plurality of third via conductors are arranged in the first direction, the plurality of fourth via conductors are arranged in the first direction, and the plurality of fourth via conductors are shifted from the plurality of third via conductors in a second direction perpendicular to the first direction.

2. The apparatus of claim 1, wherein the plurality of third via conductors are arranged in line in the first direction.

3. The apparatus of claim 2, wherein the plurality of fourth via conductors are arranged in line in the first direction.

4. The apparatus of claim 3, wherein the plurality of third and fourth via conductors are arranged in a zigzag manner.

5. The apparatus of claim 1, wherein the plurality of third conductive patterns are not adjacent to a center position of the plurality of fourth via conductors in the first direction.

6. The apparatus of claim 5, wherein the plurality of fourth conductive patterns are not adjacent to a center position of the plurality of third via conductors in the first direction.

7. The apparatus of claim 6, wherein the plurality of first, second, third, and fourth conductive patterns extend in the second direction.

8. The apparatus of claim 7, further comprising a third wiring layer located over the second wiring layer, wherein the third wiring layer includes fifth and sixth conductive patterns extending in the first direction, the fifth conductive pattern is coupled in common to the plurality of third conductive patterns, and the sixth conductive pattern is coupled in common to the plurality of fourth conductive patterns.

9. The apparatus of claim 1, further comprising a data I/O terminal coupled in common to one of the plurality of source regions and the plurality of drain regions.

10. The apparatus of claim 9, further comprising a power supply terminal coupled in common to the other of the plurality of source regions and the plurality of drain regions.

11. An apparatus, comprising:

a semiconductor substrate having a plurality of source regions and a plurality of drain regions alternately arranged in a first direction;

a plurality of gate electrodes covering the semiconductor substrate each located between an associated one of the plurality of source regions and an associated one of the plurality of drain regions;

a first wiring layer including a plurality of first conductive patterns each covering an associated one of the plurality of source regions, and the first wiring layer further including a plurality of second conductive patterns each covering an associated one of the plurality of drain regions;

a plurality of first via conductors each connected between an associated one of the plurality of first conductive patterns and an associated one of the plurality of source regions;

a plurality of second via conductors each connected between an associated one of the plurality of second conductive patterns and an associated one of the plurality of drain regions;

a second wiring layer located over the first wiring layer, the second wiring layer including a plurality of third conductive patterns each covering an associated one of the plurality of first conductive patterns, and the second wiring layer further including a plurality of fourth conductive patterns each covering an associated one of the plurality of second conductive patterns;

a plurality of third via conductors each connected between an associated one of the plurality of third conductive patterns and an associated one of the plurality of first conductive patterns; and a plurality of fourth via conductors each connected between an associated one of the plurality of fourth conductive patterns and an associated one of the plurality of second conductive patterns, wherein the plurality of third via conductors are arranged in line in the first direction, the plurality of fourth via conductors are arranged in line in the first direction, the plurality of fourth via conductors are shifted from the plurality of third via conductors in a second direction perpendicular to the first direction, and the plurality of third and fourth via conductors are arranged in a zigzag manner.

12. The apparatus of claim 11, wherein the plurality of third conductive patterns are not adjacent to a center position of the plurality of fourth via conductors in the first direction.

13. The apparatus of claim 11, wherein the plurality of fourth conductive patterns are not adjacent to a center position of the plurality of third via conductors in the first direction.

14. The apparatus of claim 11, wherein the plurality of first, second, third, and fourth conductive patterns extend in the second direction.

15. The apparatus of claim 11, further comprising a third wiring layer located over the second wiring layer, wherein the third wiring layer includes fifth and sixth conductive patterns extending in the first direction.

16. The apparatus of claim 15, wherein the fifth conductive pattern is coupled in common to the plurality of third conductive patterns by a fifth via conductor.

17. The apparatus of claim 15, wherein the sixth conductive pattern is coupled in common to the plurality of fourth conductive patterns by a sixth via conductor.

18. The apparatus of claim 11, further comprising:

a data I/O terminal coupled in common to one of the plurality of source regions and the plurality of drain regions; and a power supply terminal coupled in common to the other of the plurality of source regions and the plurality of drain regions.

19. An apparatus, comprising:

a semiconductor substrate including a plurality of source regions and a plurality of drain regions alternately arranged in a first direction;

a plurality of gate electrodes above the semiconductor substrate and each between an associated one of the plurality of source regions and an associated one of the plurality of drain regions;

a first wiring layer including:

a plurality of first conductive patterns each coupled to an associated one of the plurality of source regions by an associated one of a plurality of first via conductors; and a plurality of second conductive patterns each coupled to an associated one of the plurality of drain regions by an associated one of a plurality of second via conductors; and a second wiring layer above the first wiring layer, the second wiring layer including:

a plurality of third conductive patterns each coupled to an associated one of the plurality of first conductive patterns by an associated one of a plurality of third via conductors; and a plurality of fourth conductive patterns each coupled to an associated one of the plurality of second conductive patterns by an associated one of a plurality of fourth via conductors, wherein the plurality of fourth via conductors are shifted from the plurality of third via conductors in a second direction perpendicular to the first direction.

20. The apparatus of claim 19, wherein the plurality of third via conductors are arranged in line in the first direction, the plurality of fourth via conductors are arranged in line in the first direction, and the plurality of third and fourth via conductors are arranged in a zigzag manner.

* * * * *